United States Patent
Kim

(10) Patent No.: US 8,276,959 B2
(45) Date of Patent: Oct. 2, 2012

(54) MAGNETIC PAD FOR END-EFFECTORS

(75) Inventor: Kyung-Tae Kim, Suwon (KR)

(73) Assignee: Applied Materials, Inc., Santa Clara, CA (US)

( * ) Notice: Subject to any disclaimer, the term of this patent is extended or adjusted under 35 U.S.C. 154(b) by 358 days.

(21) Appl. No.: 12/351,409

(22) Filed: Jan. 9, 2009

(65) Prior Publication Data

US 2010/0034625 A1 Feb. 11, 2010

Related U.S. Application Data

(60) Provisional application No. 61/087,591, filed on Aug. 8, 2008.

(51) Int. Cl.
*A47J 45/00* (2006.01)
(52) U.S. Cl. ........ 294/183; 294/65.5; 294/902; 414/941
(58) Field of Classification Search ................ 294/64.1, 294/64.2, 65.5, 902; 414/941
See application file for complete search history.

(56) References Cited

U.S. PATENT DOCUMENTS

| | | | |
|---|---|---|---|
| 4,070,735 A * | 1/1978 | Canaday | 24/304 |
| 4,153,367 A | 5/1979 | Lietar et al. | |
| 4,819,167 A | 4/1989 | Cheng et al. | |
| 5,452,521 A | 9/1995 | Niewmierzycki | |
| 5,483,138 A | 1/1996 | Shmookler et al. | |
| 5,563,798 A | 10/1996 | Berken et al. | |
| 5,746,460 A | 5/1998 | Marohl et al. | |
| 5,810,935 A | 9/1998 | Lee et al. | |
| 5,917,601 A | 6/1999 | Shimazaki et al. | |
| 5,980,194 A | 11/1999 | Freerks et al. | |
| 5,984,391 A | 11/1999 | Vanderpot et al. | |
| 6,050,739 A | 4/2000 | Dunn | |
| 6,116,848 A | 9/2000 | Thomas et al. | |
| 6,117,238 A | 9/2000 | Begin | |
| 6,120,601 A | 9/2000 | Landau et al. | |
| 6,149,367 A | 11/2000 | Begin | |
| 6,159,087 A | 12/2000 | Birang et al. | |
| 6,190,037 B1 | 2/2001 | Das et al. | |
| 6,215,897 B1 | 4/2001 | Beer et al. | |
| 6,235,634 B1 | 5/2001 | White et al. | |
| 6,260,894 B1 | 7/2001 | Minnick et al. | |
| 6,267,423 B1 | 7/2001 | Marohl et al. | |

(Continued)

FOREIGN PATENT DOCUMENTS

EP 0891840 1/1999

(Continued)

OTHER PUBLICATIONS

PCT International Search Report and Written Opinion dated Nov. 20, 2006 for International Application No. PCT/US06/01724.

(Continued)

*Primary Examiner* — Dean Kramer
*Assistant Examiner* — Stephen Vu
(74) *Attorney, Agent, or Firm* — Patterson & Sheridan, LLP

(57) ABSTRACT

Embodiments of the invention relate to apparatus and method for supporting and transferring large area substrate in a vacuum condition. One embodiment of the invention provides an apparatus comprising one or more end effectors having a plurality of end effector pads disposed thereon without mechanically joining to the one or more end effectors. In one embodiment, a plurality of end effector pad assemblies are coupled to one or more end effectors by magnetic force.

13 Claims, 20 Drawing Sheets

U.S. PATENT DOCUMENTS

| | | |
|---|---|---|
| 6,276,731 B1 | 8/2001 | Hino |
| 6,294,296 B1 | 9/2001 | Weigl |
| 6,322,116 B1 | 11/2001 | Stevens |
| 6,327,517 B1 | 12/2001 | Sundar |
| 6,339,730 B1 | 1/2002 | Matsushima et al. |
| 6,356,346 B1 | 3/2002 | Hagen et al. |
| 6,409,453 B1 | 6/2002 | Brodine et al. |
| 6,428,266 B1 * | 8/2002 | Solomon et al. ............ 414/744.4 |
| 6,435,798 B1 | 8/2002 | Satoh |
| 6,474,712 B1 | 11/2002 | Govzman et al. |
| 6,502,054 B1 | 12/2002 | Mooring et al. |
| 6,556,807 B1 | 4/2003 | Horie et al. |
| 6,556,887 B2 | 4/2003 | Freeman et al. |
| 6,577,923 B1 | 6/2003 | White et al. |
| 6,629,053 B1 | 9/2003 | Mooring |
| 6,634,686 B2 | 10/2003 | Hosokawa |
| 6,684,123 B2 | 1/2004 | Jevtic et al. |
| D489,966 S * | 5/2004 | Ho ................................. D8/382 |
| 7,073,834 B2 | 7/2006 | Matsumoto et al. |
| 7,192,017 B2 * | 3/2007 | Wang et al. ..................... 269/21 |
| 7,234,744 B2 * | 6/2007 | Osten et al. ..................... 294/65 |
| 7,440,091 B2 | 10/2008 | Bagley et al. |
| 7,520,714 B2 * | 4/2009 | Miyazawa ..................... 414/735 |
| D608,973 S * | 1/2010 | Kanda et al. .................. D34/35 |
| 7,793,408 B2 * | 9/2010 | Oh ................................. 29/743 |
| 7,875,144 B2 * | 1/2011 | Kobayashi ..................... 156/247 |
| 2001/0024609 A1 | 9/2001 | White et al. |
| 2002/0021959 A1 | 2/2002 | Schauer et al. |
| 2002/0111710 A1 | 8/2002 | Perlov et al. |
| 2003/0012631 A1 | 1/2003 | Pencis et al. |
| 2003/0014155 A1 | 1/2003 | Pencis et al. |
| 2003/0083776 A1 | 5/2003 | Schauer et al. |
| 2003/0117680 A1 | 6/2003 | Allen et al. |
| 2003/0132746 A1 | 7/2003 | Cox |
| 2003/0149947 A1 | 8/2003 | Sarig |
| 2003/0154002 A1 | 8/2003 | Lappen et al. |
| 2003/0161706 A1 | 8/2003 | Kurita et al. |
| 2003/0179369 A1 | 9/2003 | Feldman et al. |
| 2003/0218741 A1 | 11/2003 | Guetta |
| 2003/0227618 A1 | 12/2003 | Some |
| 2004/0016896 A1 | 1/2004 | Almogy et al. |
| 2004/0055397 A1 | 3/2004 | Kurita |
| 2004/0067127 A1 | 4/2004 | Hofmeister et al. |
| 2004/0075068 A1 | 4/2004 | Feldman et al. |
| 2004/0113444 A1 | 6/2004 | Blonigan et al. |
| 2005/0285419 A1 | 12/2005 | Matsumoto et al. |
| 2006/0087647 A1 | 4/2006 | Bagley et al. |

FOREIGN PATENT DOCUMENTS

| | | |
|---|---|---|
| EP | 1102137 | 5/2001 |
| JP | 6247507 | 9/1994 |
| JP | 2001189367 | 7/2001 |
| JP | 2006196842 | 7/2006 |
| KR | 20040000600 | 1/2004 |

OTHER PUBLICATIONS

International Search Report and Written Opinion dated Mar. 19, 2010 for International Application No. PCT/US2009/052919.

* cited by examiner

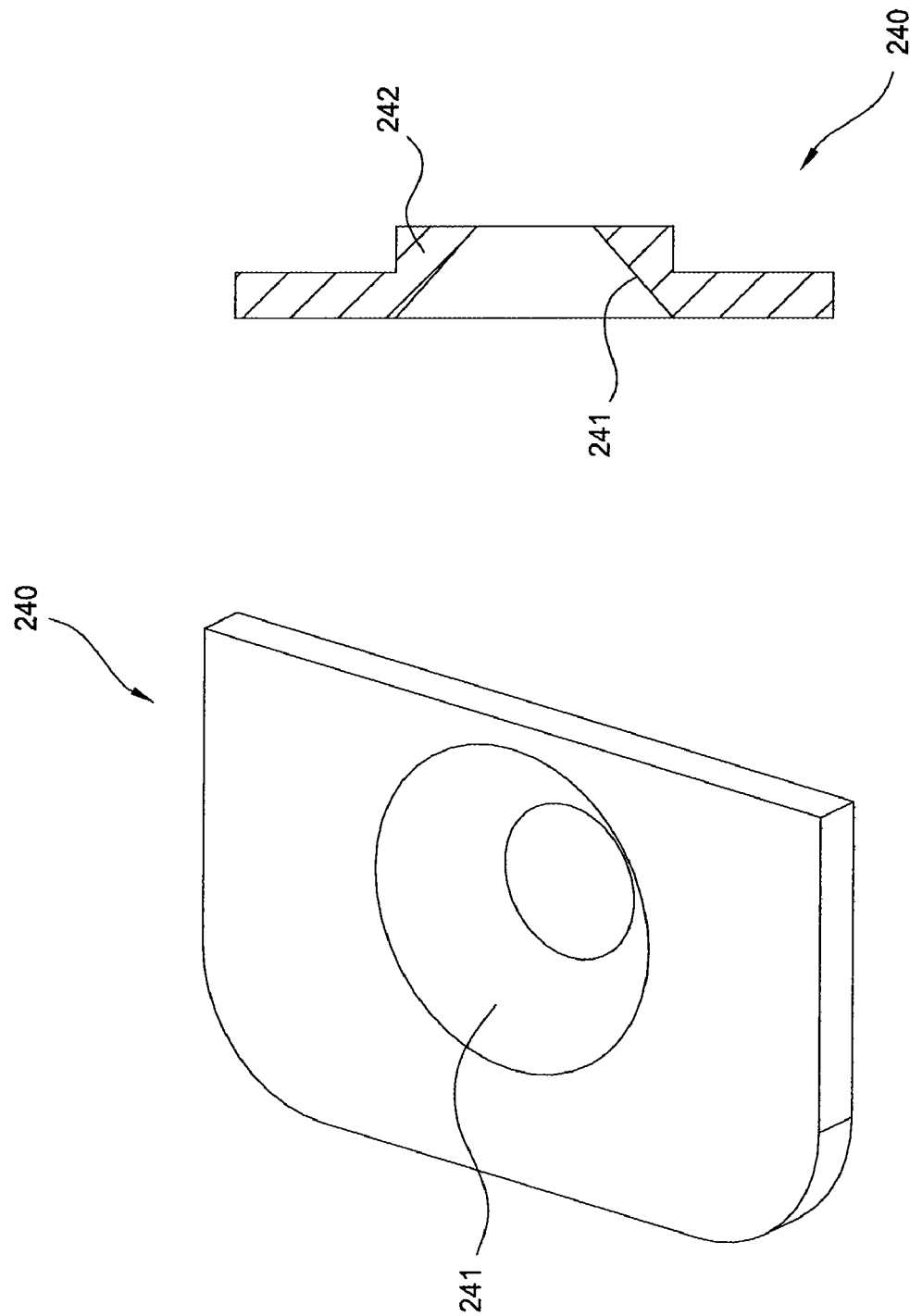

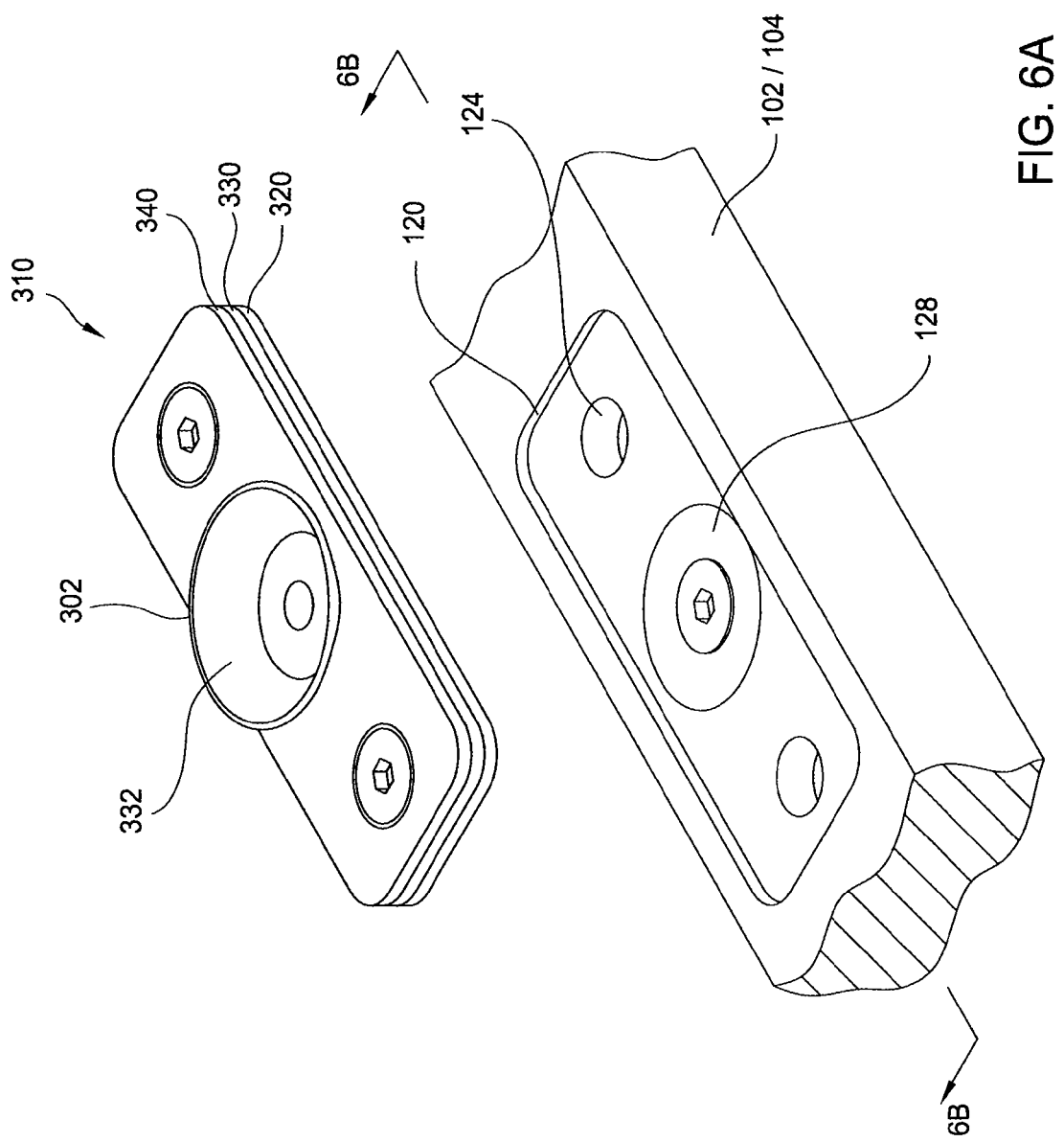

SECTION A-A

MAGNETIC PAD FOR END-EFFECTORS

CROSS-REFERENCE TO RELATED APPLICATIONS

This application claims priority to co-pending U.S. Provisional Patent Application Ser. No. 61/087,591, filed Aug. 8, 2008, which is herein incorporated by reference in its entirety.

BACKGROUND OF THE INVENTION

1. Field of the Invention

Embodiments of the present invention generally relate to apparatus and method for supporting a substrate during transfer operations. Particular, embodiments of the present invention relate to apparatus and method for supporting and transferring large area substrate in a vacuum condition.

2. Background

Large area substrates are generally used in manufacturing solar panels, flat panel displays—such as active matrix, or thin film transistor (TFT) displays, liquid crystal displays (LCD), plasma displays, and the like.

With the marketplace's acceptance of solar technology and flat panel technology, the demand for larger solar panels or flat display panels, increased production, and lower manufacturing costs have driven equipment manufacturers to develop new systems that accommodate larger size substrates for solar panel and flat panel display fabricators.

Large area substrate processing is typically performed by subjecting a substrate to a plurality of sequential processes to create devices, conductors, and insulators on the substrate. Each of these processes is generally performed in a process chamber configured to perform one or more steps of the production process. In order to efficiently complete the entire sequence of processing steps, a number of process chambers are typically coupled to a central transfer chamber that houses a robot to facilitate transfer of the substrate between the process chambers. Processing platforms having this configuration are generally known as cluster tools. Such cluster tools for glass substrate processing are available from AKT, Inc., a wholly-owned subsidiary of Applied Materials, Inc., of Santa Clara, Calif.

As large area substrates increase in size, the manufacturing equipment for handling and processing these substrates must become larger as well. The increased size of substrate handling equipment, such as the transfer robot mentioned above, has created a number of technical challenges that must be overcome in order to maintain accurate substrate transfer. For example, one transfer robot used to handle flat panel substrates has a series of cantilevered end effectors supported from a wrist that support that underside of the substrate. A plurality of pads are generally attached to the end effectors for direct contact with the substrates. The pads subject to wear and need to be replaced periodically. Replacing the pads takes a relative long time due to the relatively large number of the pads and the entire cluster tool needs to be shut down during pad replacement. As a result, the cost of ownership increases due to the long period required by replacing pads on the end effector.

Therefore, there is a need for an end effector and end effector pads with reduced maintenance requirement to accommodate large substrates

SUMMARY OF THE INVENTION

The present invention generally relates to apparatus and method for supporting a substrate during transfer operations. Particular, embodiments of the present invention relate to apparatus and method for supporting and transferring large area substrate in a vacuum condition.

One embodiment of the present invention provides an apparatus for supporting and transferring large area substrates in a vacuum environment, comprising a wrist adapted to a driving mechanism, one or more end effectors coupled to the wrist, wherein the one or more end effectors are configured to receive and support a large area substrate, a plurality of end effector pads disposed on a substrate receiving surface of the one or more end effectors, wherein the plurality of end effector pads are configured to receive the large area substrate and prevent direct contact between the large area substrate and one or more end effectors, the plurality of end effector pads are not mechanically joined to the one or more end effectors using any fasteners for easy replacement of the plurality of end effector pads.

Another embodiment of the present invention provides a pad assembly for an end effector of a vacuum robot comprising a base member adapted to secure the pad assembly to the end effector, wherein the base member having a first side for contacting with the end effector and a second side opposing the first side, a pad member coupled to the base member, wherein the pad member has a first side in contact with the second side of the base member and a second side opposing the first side of the pad member, and at least a portion of the second side of the pad member is raised to form a contacting area for receive and support a substrate, and a fastening means to join the base member and the pad member.

Yet another embodiment of the present invention provides a pad assembly for an end effector of a vacuum robot comprising a pad member configured to provide a contact area for the vacuum robot, wherein the pad member has a first side and a second side opposing the first side, the first side is substantially planar, the second side has a contact structure extending therefrom and a top surface of the contact structure forms the contact area, a base member adapted to secure the pad assembly to the end effector, wherein the base member is in contact with the pad member from the first side, a clamp member contacting the pad member from the second side, wherein the clamp member has a hole allowing the contact structure to be exposed, and a fastening means to join the base member, the pad member and the clamp member.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5E is a schematic isometric view of a clamp member for the end effector pad assembly of FIG. 5A.

FIG. 5F is a schematic sectional view of the clamp member of FIG. 5E.

FIG. 6A is an isometric view of an end effector pad assembly and an end effector in accordance with another embodiment of the present invention.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to apparatus and method for supporting a substrate during transfer operations. Particular, embodiments of the present invention relate to apparatus and method for supporting and transferring large area substrate in a vacuum condition. One embodiment of the present invention provides an apparatus for transferring and supporting large area substrates, wherein the apparatus comprises one or more end effectors having a plurality of end effector pad assemblies secured thereon without mechanically joined to the end effectors by fasteners. In one embodiment, the plurality end effector pad assemblies are secured to the one or more end effectors by magnetic force.

In one embodiment of the present invention, a magnetic core is disposed in the one or more end effector for securing an end effector pad assembly nearby. In one embodiment of the present invention, each of the plurality of end effector pad assembly comprises a pad member for contacting a substrate to be transferred and a ferromagnetic base member for securing the end effector pad assembly to an end effector having one or more disposed magnet therein.

In one embodiment of the present invention, the ferromagnetic base member having a raised portion configured to raise a portion of the pad member to form a contact area. In another embodiment, the pad member has a protruding structure for contacting the substrates. In one embodiment, the protruding structure has a cone shape with an open end of the cone configured to contact the substrate being transferred.

Figure 1:
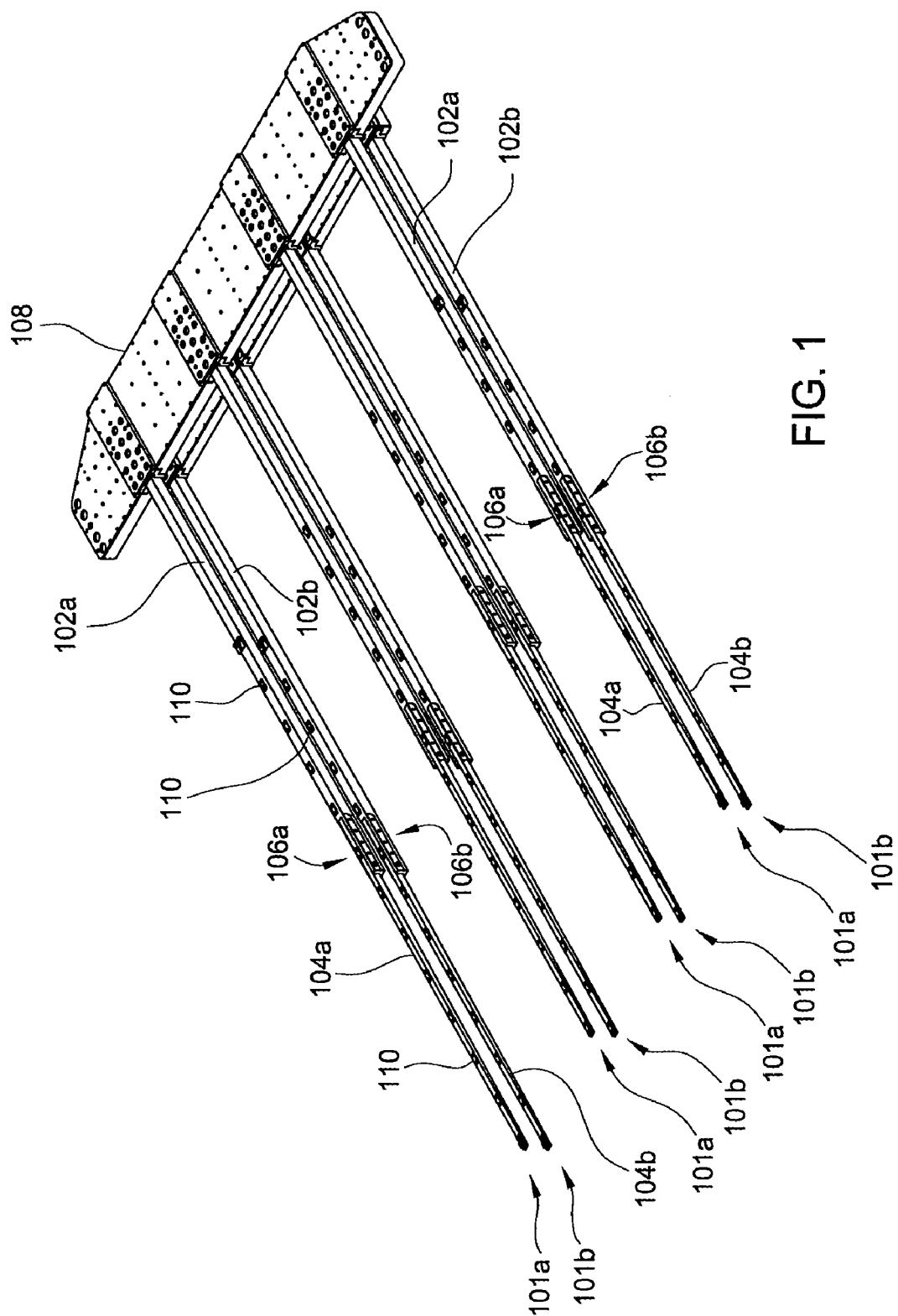
FIG. 1 is a schematic isometric view of an end effector assembly in accordance with one embodiment of the present invention.

FIG. 1 is a schematic isometric view of an end effector assembly 100 in accordance with one embodiment of the present invention. The end effector assembly 100 comprises a plurality of end effectors 101 configured to receive and support one or more large area substrates. In one embodiment, the plurality of end effectors 101 are held in substantially parallel alignment by a wrist 108 such that a substrate may be supported by the end effectors 101.

The wrist 108 is generally connected to a driving mechanism, such as a transfer robot, for moving the end effector assembly 100 along with the substrates supported thereon. In one embodiment, the end effector assembly 100 is configured to be used in a vacuum environment.

The wrist 108 may be fabricated from materials selected to minimize thermal effects during substrate transfer. Examples of materials that are suitable for fabrication of the wrist 108 include, but are not limited to, aluminum/silicon carbide composites, glass ceramics (such as Neoceram N-0 and Neoceram N-11, among others), aluminum/iron composites, carbon, carbon matrix composites, cast aluminum alloy, commercially pure chromium, graphite, molybdenum, titanium alloy, molybdenum tungsten alloy, commercially pure molybdenum, ZERODUR® glass-ceramic, INVAR® alloy, titanium Ti-6Al-4V alloy, 8090 aluminum MMC, and metal matrix composites. Metal matrix composites generally include aluminum or other light metal (i.e., magnesium, titanium, aluminum, magnesium alloys, titanium alloys and aluminum alloys) with up to 30 percent fillers, such as silicon carbide and the like.

As shown in FIG. 1, eight end effectors 101 are coupled to the wrist 108 and are configured to support two large area substrates simultaneously. The four end effectors 101a form an upper substrate support surface to support a first substrate and the four end effectors 101b form a lower substrate support surface to support a second substrate. Although four end effectors 101 are shown for each substrate support surface, it is contemplated that other quantities of end effectors 101, e.g., at least two, may also be effectively utilized. Although, the end effector 100 is shown to support two substrates, other configurations, such as single substrate support, three or more substrate support, are also contemplated.

In one embodiment, each end effector 101 comprises a base 102 coupled to a tip 104 by a clamp assembly. Particularly, each end effector 101a comprises a base 102a coupled to a tip 104a by a clamp assembly 106a and each end effector 101b comprises a base 102b coupled to a tip 104b by a clamp assembly 106b. In one embodiment, each end effector 101 has a body gradually thinning from the wrist 108 to a far end of the tip 104 to achieve a combination of lightweight and rigidity.

In one embodiment, the base 102 and the tip 104 of the end effector 101 are generally fabricated from materials having high temperature durability. Density of the materials is also an important factor since the end effector may droop, or sag, due to its own weight. This effect may be exacerbated in high temperature applications. Suitable materials may include but not limited to carbon fiber reinforced polymer (CFRP), alumina, metal matrix composite (MMC), an aluminum beryllium matrix.

In one embodiment, the base 102 and the tip 104 of each end effector 101 may be made of ceramic due to its small droop (high Young's modulus) and high temperature durability. Examples of suitable ceramics include, but are not limited to, alumina, silicon carbide (SiC), silicon nitride (SiN), and the like.

The base 102 and the tip 104 of the end effector 101 are generally designed so that each piece of the end effector 101 can be made within existing furnaces. It is contemplated that the end effector 101 may alternatively be made in one piece if suitably sized furnaces are used.

Alternatively, different materials may be used for the base 102 and the tip 104 of the two-piece end effector 101. For example, in one embodiment, the base 102 of the end effector 101 may be made of a metal or CFRP. The use of metal or CFRP allows the base 102 to withstand larger stresses while, due to its smaller size, not adding significant momentum to the movement to the end effector 101.

In one embodiment, the tip 104 of the end effector 101 may be made of ceramic. This minimizes droop or sag while advantageously utilizing the higher temperature durability of ceramic vis-à-vis other materials. Either or both of the base 102 and the tip 104 of the end effector 101 may be made of any of the materials listed above as suitable for the wrist 108. It is contemplated that other materials and/or combinations of materials may be equally used for this application in accordance with the teachings disclosed herein.

It is further contemplated that each end effector 101 coupled to the wrist 108 may be made of different materials and/or different combinations of materials than the other end effector 101. For example, the composition of two or more end effectors 101 may be selected to differentiate the resonant frequencies of the respective end effectors 101 and the robot connected thereto and thereby minimize vibration of the robot and/or end effectors 101.

Each end effector 101 further comprises a plurality of end effector pad assemblies 110 configured to in direct contact with substrates supported thereon. Each end effector pad assembly 110 has a raised portion configured to in direct contact with substrates providing padded contact with suitable friction and reduced particle generation. The plurality of end effector pad assemblies 110 are disposed over each of the end effectors 101 and the raised portions collectively form a contacting surface for receiving and supporting a back surface of a substrate being transferred. In one embodiment, the plurality of end effector pad assemblies 110 are evenly disposed distributed along a length of each end effector 101.

Each of the end effector pad assembly 110 has a soft, padded, or other surface disposed on it that will not damage a substrate. The end effector pad assembly 110 can be rigid, or can be slightly flexible to provide cushioning for a substrate. The end effector pad assemblies 110 are capable of supporting a substrate to minimize cracking or breaking of the substrate. Any number of end effector pad assemblies 110 can be disposed on the end effectors, as long as sufficient support is provided. In one embodiment, 96 end effector pad assemblies 110 are affixed to the end effectors 101 and are configured to support one substrate. However, depending on substrate size, more or fewer end effector pad assemblies 110 may be utilized.

In one embodiment, the plurality of end effector pad assemblies 110 are removably disposed over the end effectors 101 and can be removed and replaced when worn. In one embodiment, to reduce down time when replacing the end effector pad assemblies 110, the plurality of end effector pad assemblies 110 are disposed on the end effectors 101 without mechanically joined to the end effectors 110 using any fasteners for each replacement.

In one embodiment, the plurality of end effector pad assemblies 110 are disposed on the end effectors 101 by magnetic force. In one embodiment, each of the end effector 101 comprises a plurality of magnet assemblies 128 and each of the end effector pad assemblies 110 comprises a ferromagnetic member to secure the end effector pad assembly 110 to then the end effector 101 near a corresponding magnet assembly 128.

Figure 2:
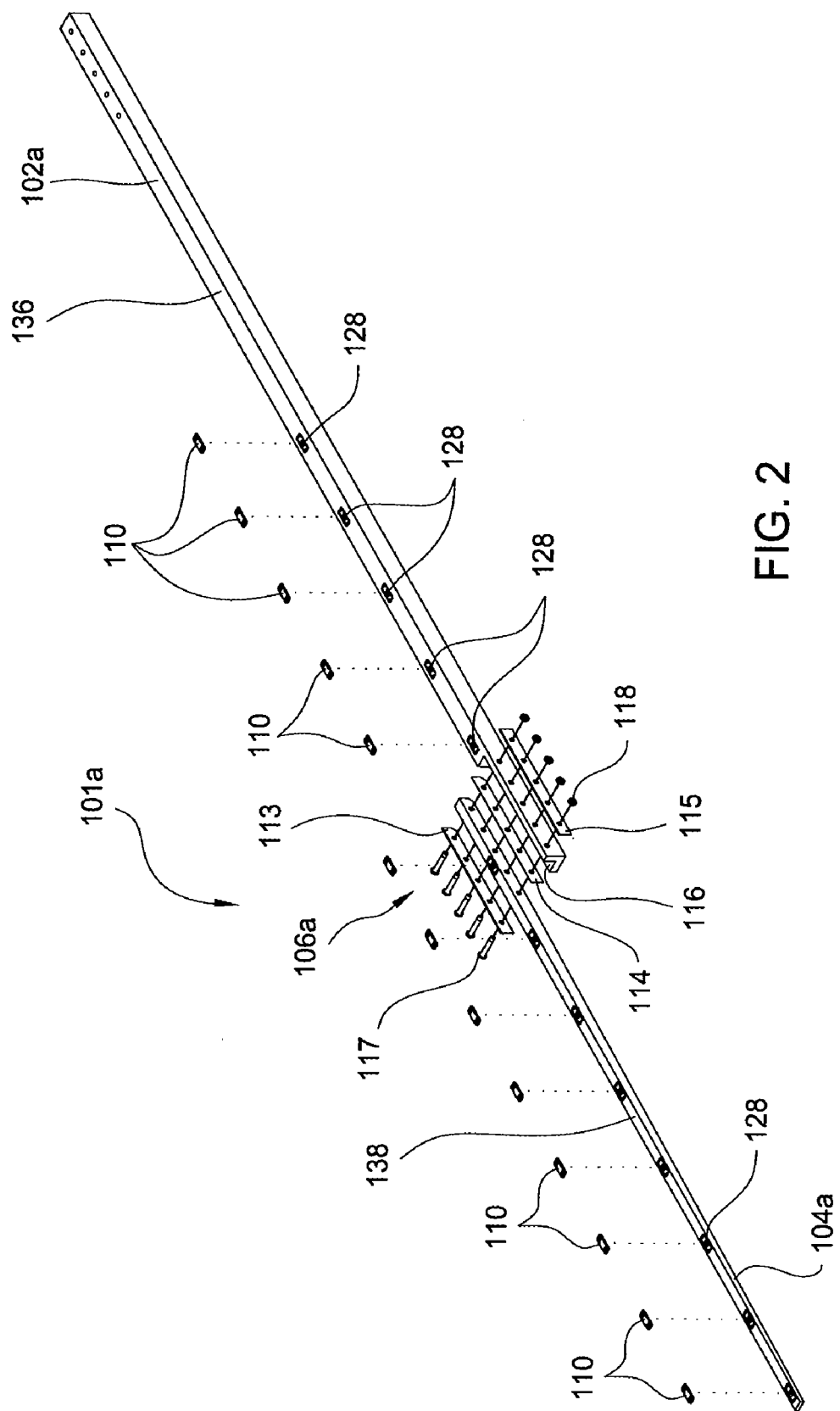
FIG. 2 is a schematic exploded view of an end effector of the end effector assembly of FIG. 1.

FIG. 2 is a schematic exploded view of one of the end effector 101a in accordance to one embodiment of the present invention. The end effector 101a comprises a base 102a coupled to a tip 104a by a clamp assembly 106a. A rabbet 116 is formed in the base 102a for receiving the tip 104a. A plurality of screws 117 and nuts 118 join the base 102a and the tip 104a. In one embodiment, pads 113, 114, 115 may be used in joining the base 102a and tip 104a.

The plurality of magnet assemblies 128 are disposed in recesses formed in upper surfaces 136 and 138 of the base 102a and the tip 104a. Each end effector pad assemblies 110 are secured to the end effector 101a near a magnet assembly 128. Each of the plurality of end pad assemblies 110 has a raised portion protruding over the upper surfaces 136 and 138 and provides a contact area for the end effector 101a.

Figure 3A:
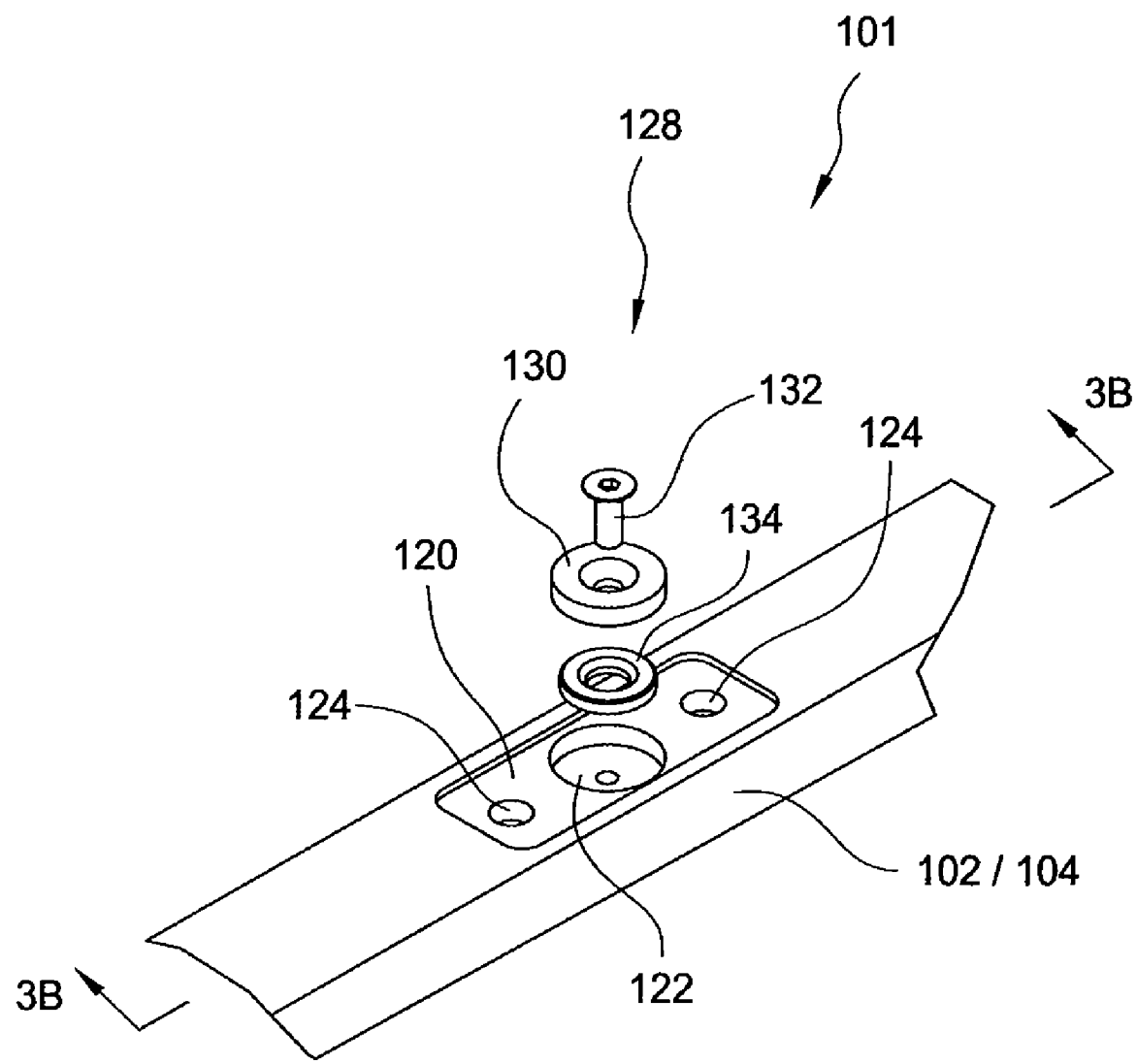
FIG. 3A is a schematic exploded view of a magnetic assembly in an end effector in accordance with one embodiment of the present invention.

FIG. 3A is a schematic exploded view of a magnetic assembly 128 in an end effector in accordance with one embodiment of the present invention. The magnetic assembly 128 comprises a magnet core 134, a cover 130, and a fastener 132 configured to secure the magnet core 134 and the cover to the tip 104 or the base 102 of the end effector 101.

Figure 3B:
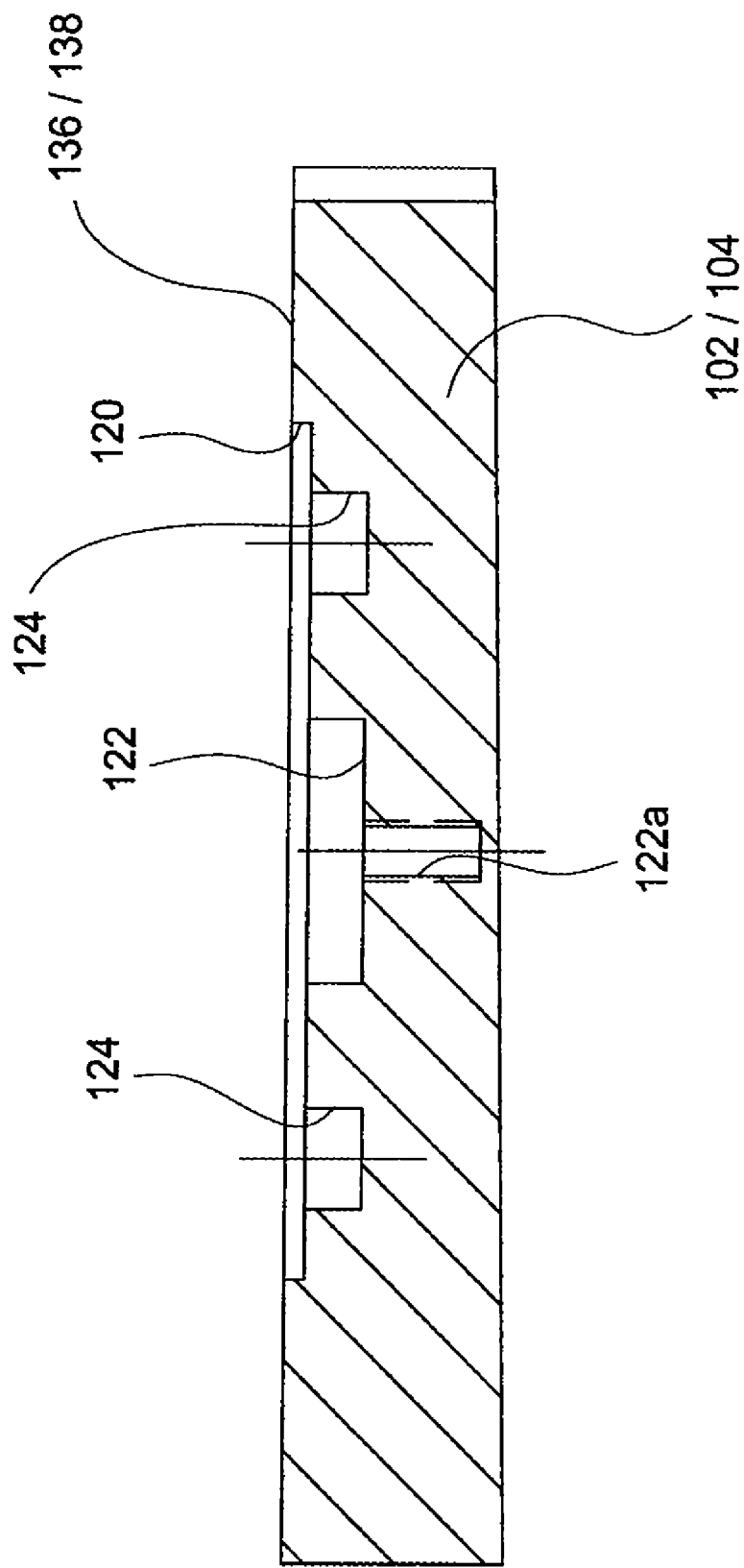
FIG. 3B is a schematic sectional side view of an end effector showing structure for a magnetic assembly.
Figure 3C:
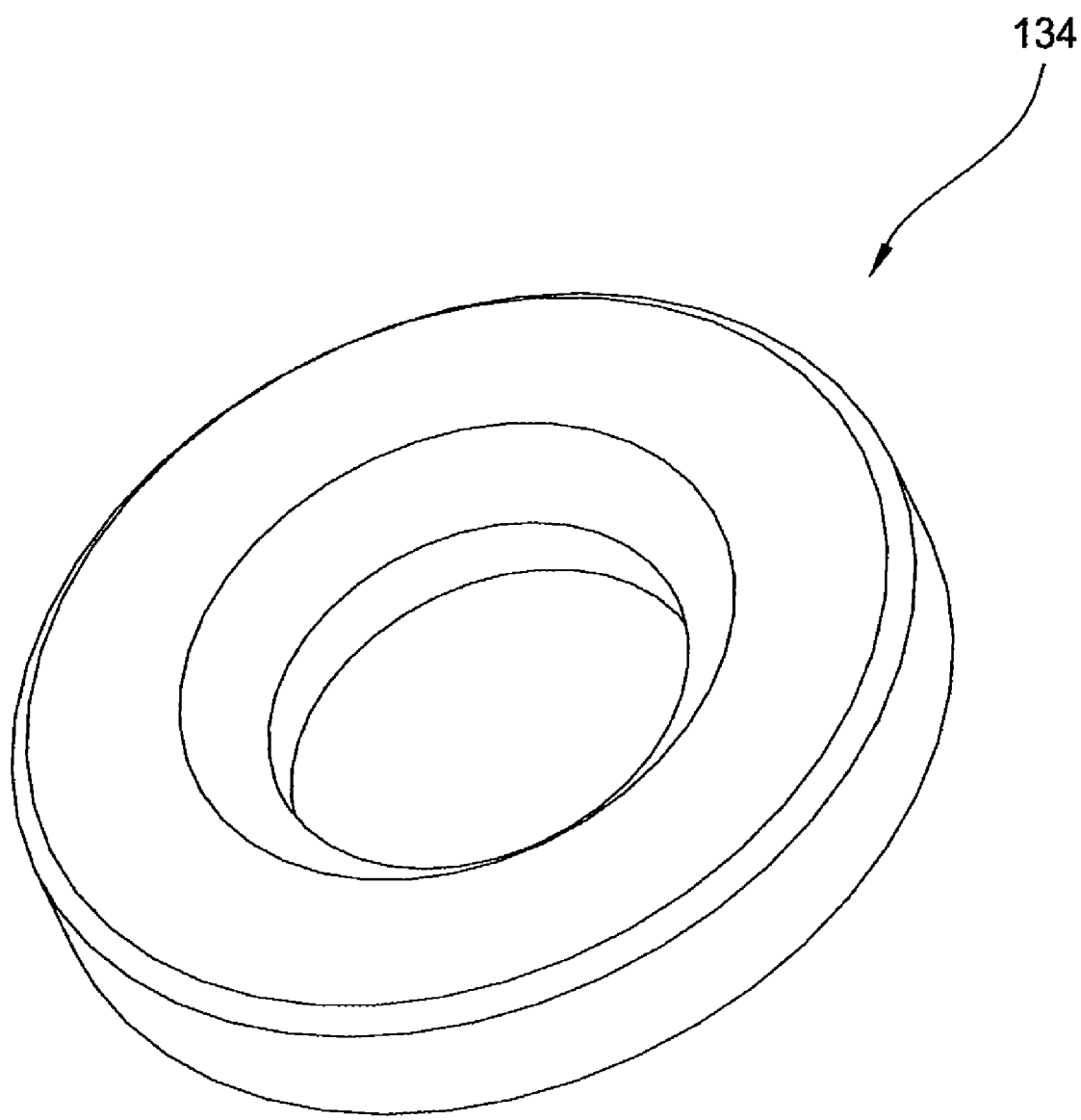
FIG. 3C is a schematic isometric view of a magnetic core of the magnetic assembly of FIG. 3A.

FIG. 3C is a schematic isometric view of the magnetic core 134 in accordance with one embodiment of the present invention. The magnetic core 134 has a substantially ring shape. In one embodiment, the magnet core 134 is fabricated from a strong permanent magnet to provide a magnetic force strong enough to secure an end effector pad assembly, particular in a vacuum environment, and a light weight suitable for remaining rigidity of the end effector.

In one embodiment, the magnetic core 134 is formed from a samarium cobalt magnet of grade 38. In one embodiment, the magnetic core 134 comprises a coating over a permanent magnet. In one embodiment, the magnetic core 134 is coated with yttrium oxide ($Y_2O_3$). In one embodiment, the magnetic core 134 has a weight of less than 10 grams.

Figure 3D:
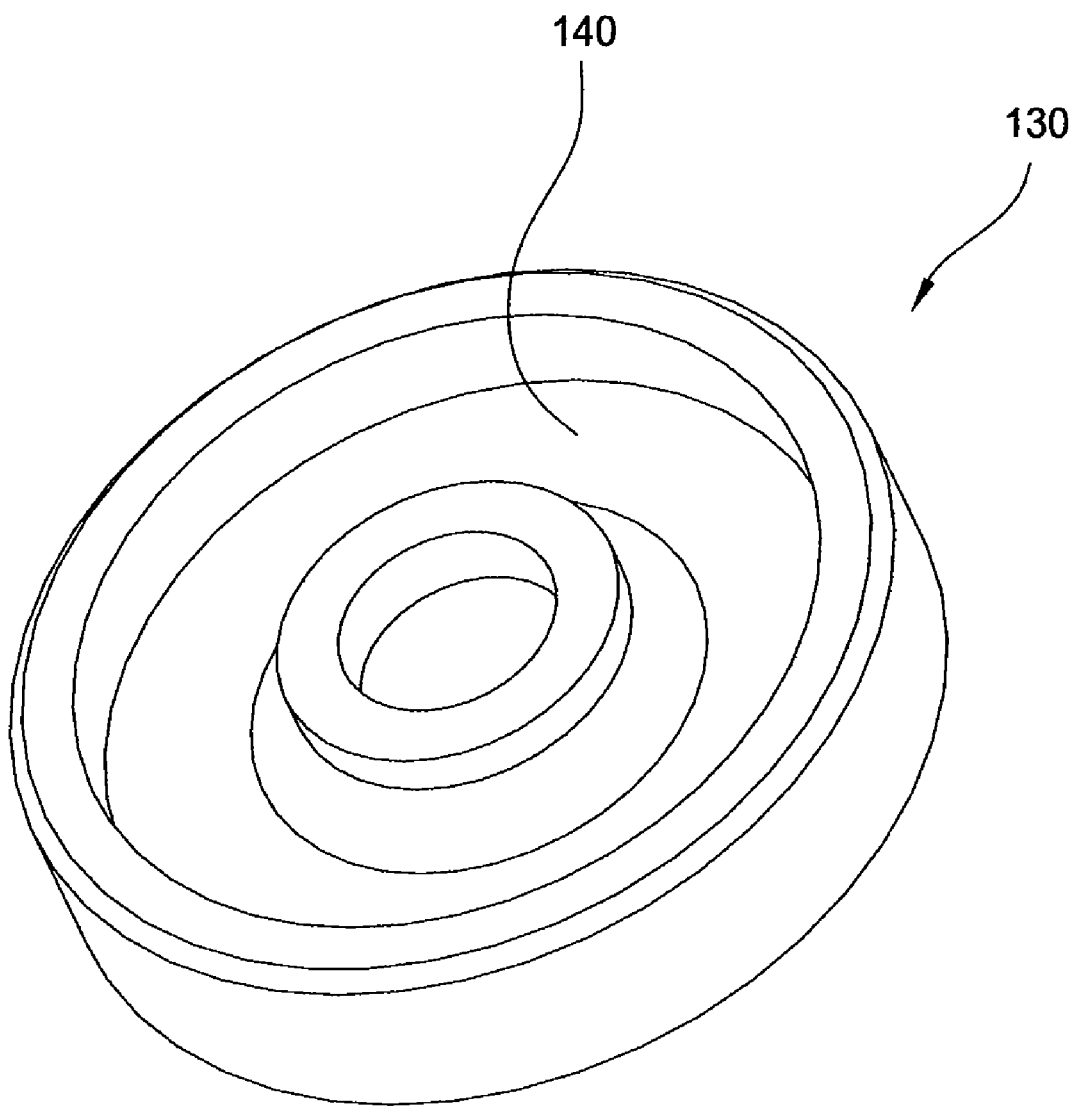
FIG. 3D is a schematic isometric view of a cover of the magnetic assembly of FIG. 3A.

FIG. 3D is a schematic isometric view of the cover 130 in accordance with one embodiment of the present invention. The cover 130 is configured to prevent direct metal contact between the magnetic core 134 and an end effector pad assembly to be secured nearby. The cover 130 has substantially ring shape having a cavity 140 forming in one side. The cavity 140 is configured to with accommodate a magnetic core, such as the magnetic core 134, therein. In one embodiment, the cover 130 is fabricated from a high performance polyimide-based polymer. In one embodiment, the magnetic core 134 is fabricated from VESPEL® polymer from DuPont.

In one embodiment, the cover 130 is fabricated from thermoplastic, such as polyetheretherketone (PEEK).

In one embodiment, the end effectors 101 have a plurality of recesses formed therein to house the magnetic assemblies 128. FIG. 3B is a schematic sectional side view of a structure in the end effector for housing the magnetic assembly 128 in accordance with one embodiment of the present invention. The base 102/tip 104 has a plurality of recesses 122 configured to accommodate the magnetic core 134 and the cover 130. A threaded hole 122a may be extending from the recess 122 to allow the fastener 132 to be secured therein.

As shown in FIG. 3B, the recess 122 may be formed in a pad recess 120 configured to provide a guide and accommodation to an end effector pad assembly 110. In one embodiment, the base/tip 102/104 may have guide holes 124 to provide accurate alignment to an end effector pad assembly 110.

Figure 4A:
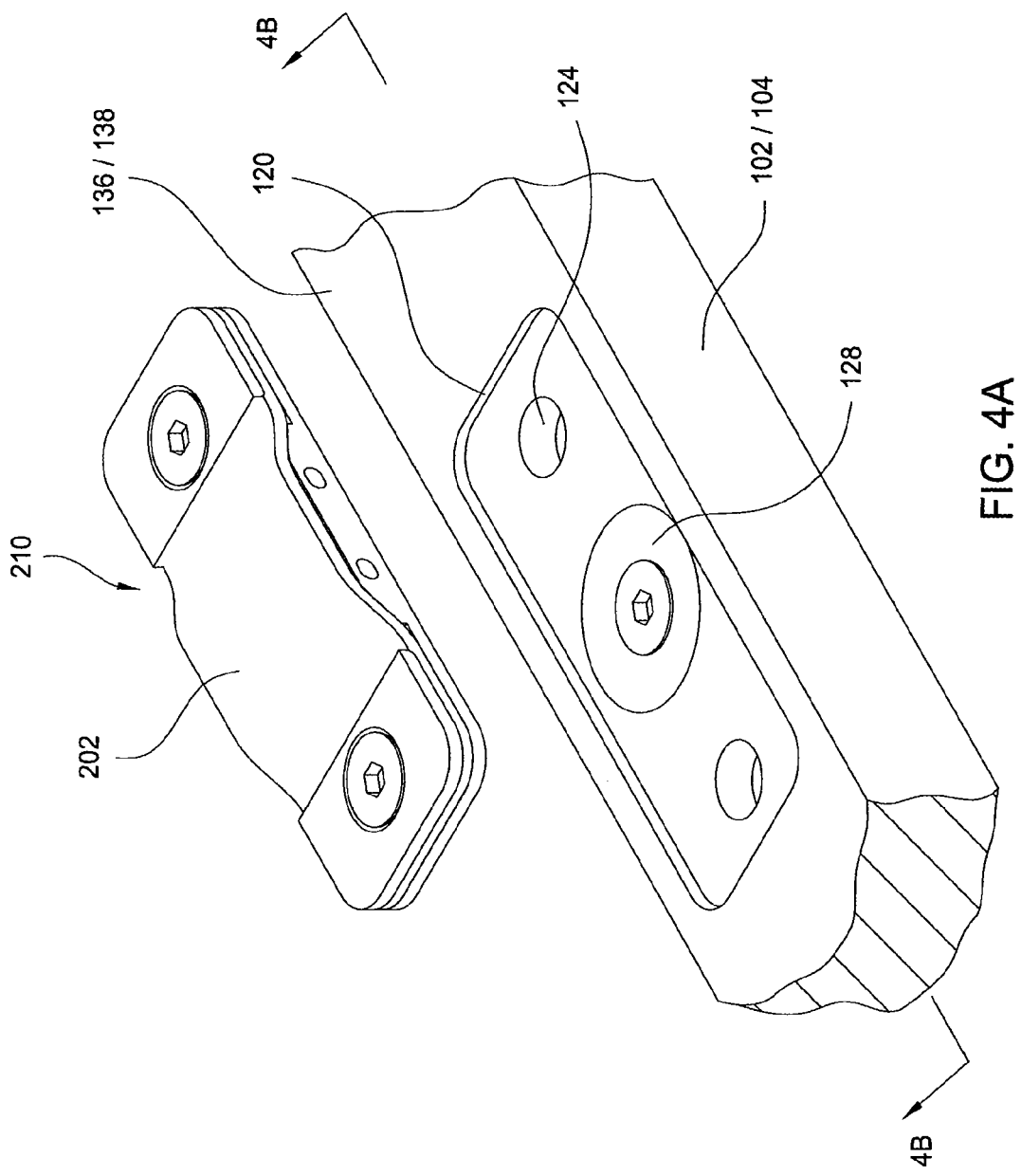
FIG. 4A is a schematic isometric view of an end effector pad assembly and an end effector in accordance with one embodiment of the present invention.

FIG. 4A is a schematic isometric view of an end effector pad assembly 210 in accordance with one embodiment of the present invention. The end effect pad assembly 210 may be used in place of the end effector pad assembly 110 of FIG. 1. The end effector pad assembly 210 is configured to "sit" within a pad recess 120 of the base or tip 102/104 of an end effector.

Figure 4B:
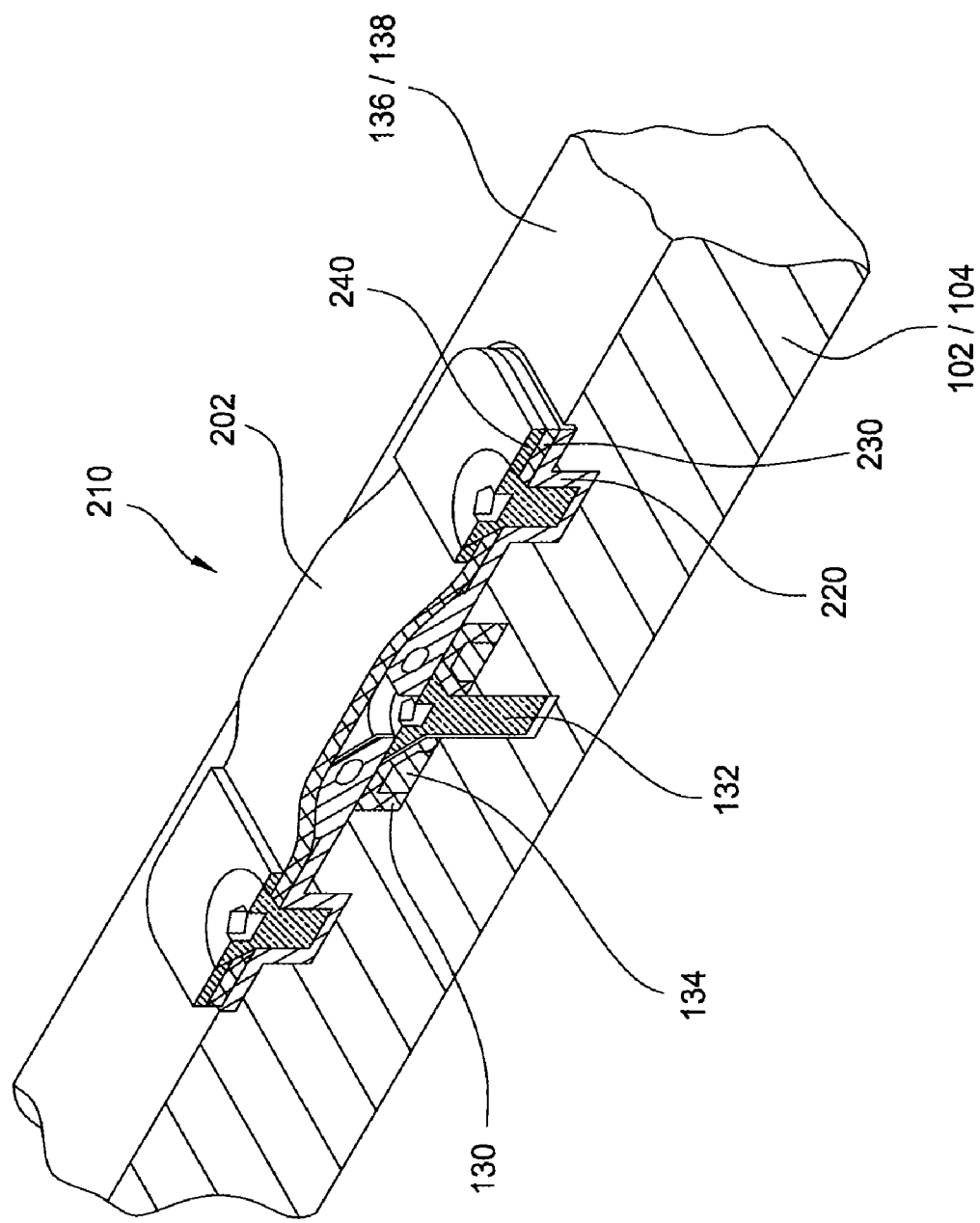
FIG. 4B is a schematic side view of the end effector pad assembly of FIG. 4A when disposed on an end effector.

FIG. 4B is a schematic isometric sectional view of the end effector pad assembly 210 disposed in the base/tip 102/104 of an end effector. The end effector pad assembly 210 has a contact area 202 protruding above the rest of the end effector pad assembly 210 and the upper surface 136/138 of the end effector when the end effector pad assembly 210 is disposed on the end effector.

Figure 5A:
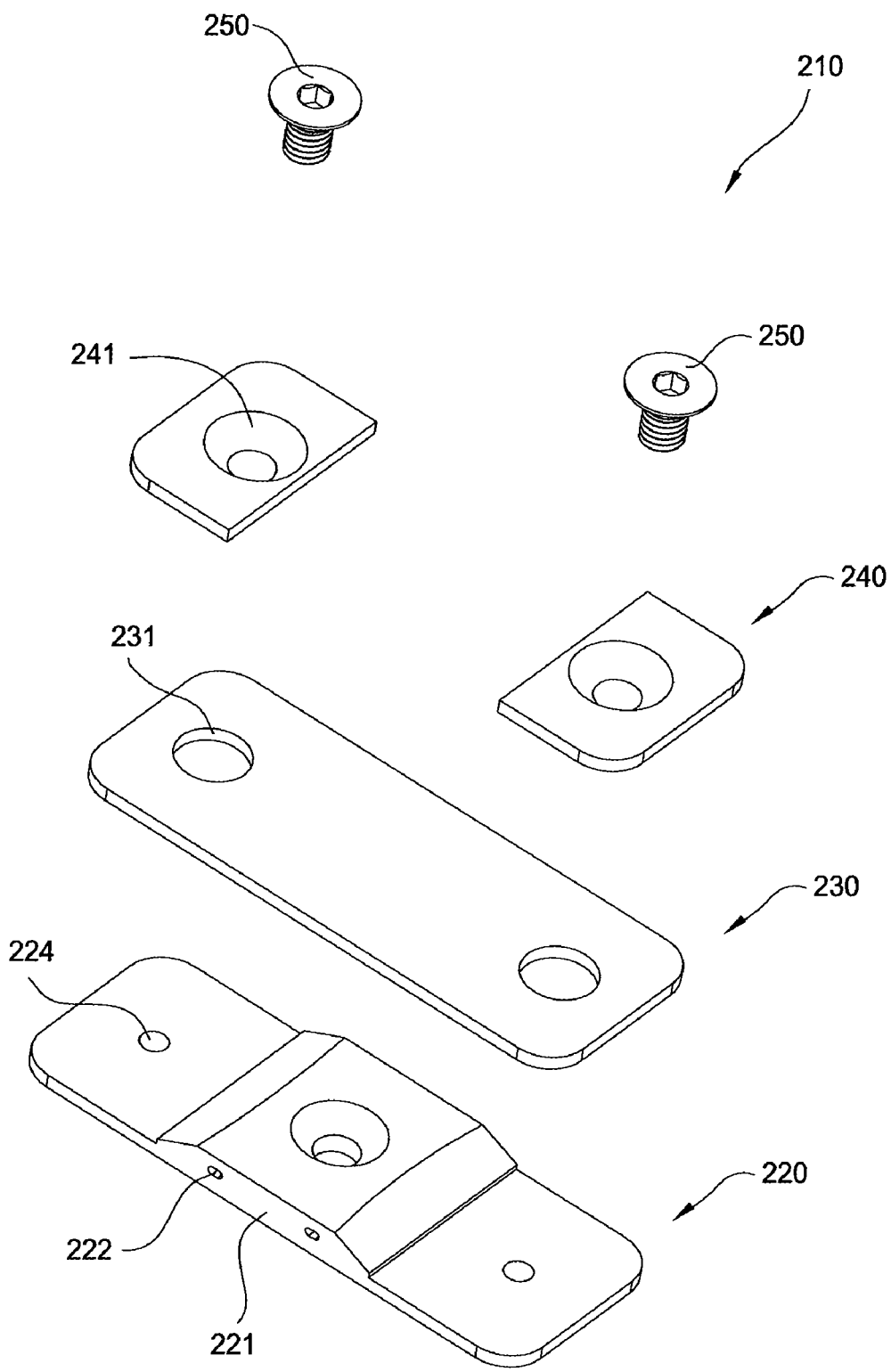
FIG. 5A is a schematic exploded view of the end effector pad assembly of FIG. 4A.

FIG. 5A is a schematic exploded view of the end effector pad assembly 210. The end effector pad assembly 210 comprises a base member 220, a pad member 230, and clamp members 240 stacked together by screws 250. The base member 220 is configured to provide physical support to the end effector assembly 210 and to provide magnet attraction to magnets in the end effector. The pad member 230 is fabricated from a flexible material and is configured to provide padded contact to substrates being processed. The end effector pad assembly 210 is preassembled and is configured to be disposed on the end effector and removed from the end effector in a whole.

Figure 5B:
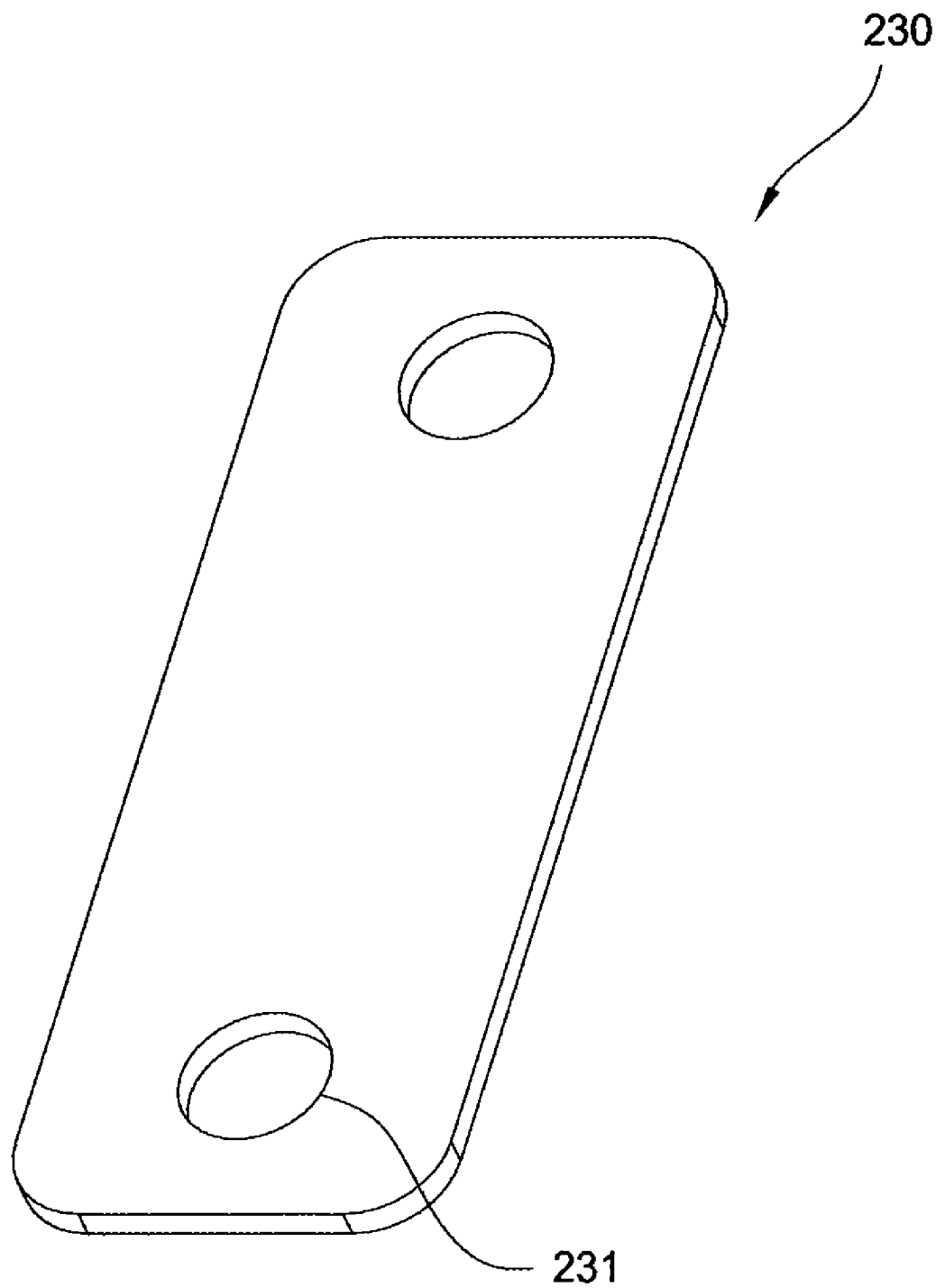
FIG. 5B is a schematic isometric view of a pad member for the end effector pad assembly of FIG. 5A.

FIG. 5B is an isometric view of the pad member 230 in accordance with one embodiment of the present invention. The pad member 230 has a plate shape. In one embodiment, the pad member 230 has a pair of holes 231 configured to let through the screws 250.

The pad member 230 is fabricated from a flexible material that provides cushioning to the substrates being transferred. The pad member 230 is generally fabricated from material that will not scratch the substrate and is compatible with processing chemistry. In one embodiment, the pad member 230 has a thickness of about 0.4 inch. In one embodiment, the pad member 230 is fabricated from a perfluoroelastomer. In one embodiment, the pad member 230 is fabricated from KALRETZ® elastomer by DuPont.

Figure 5C:
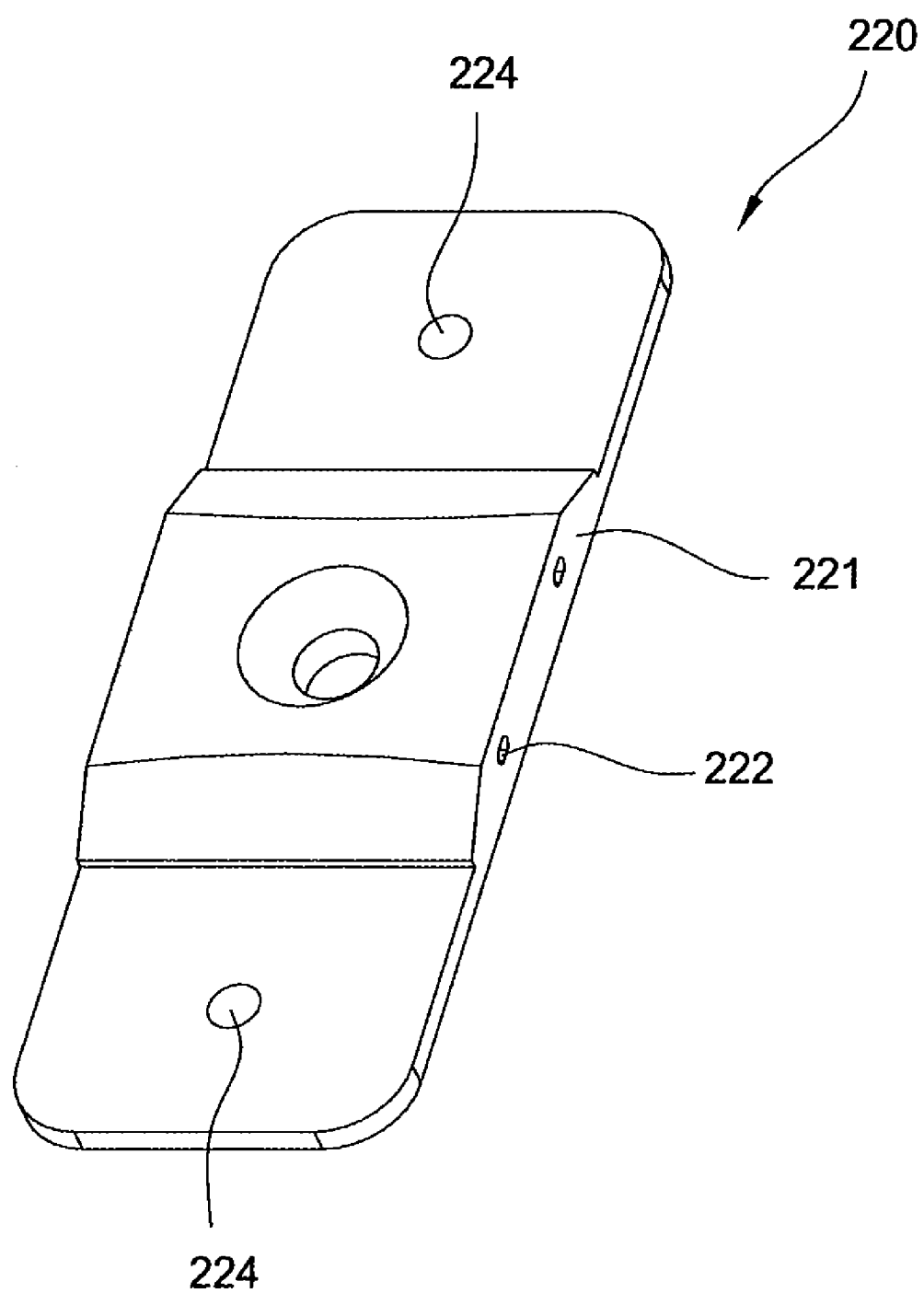
FIG. 5C is a schematic isometric view of a base member for the end effector pad assembly of FIG. 5A.
Figure 5D:
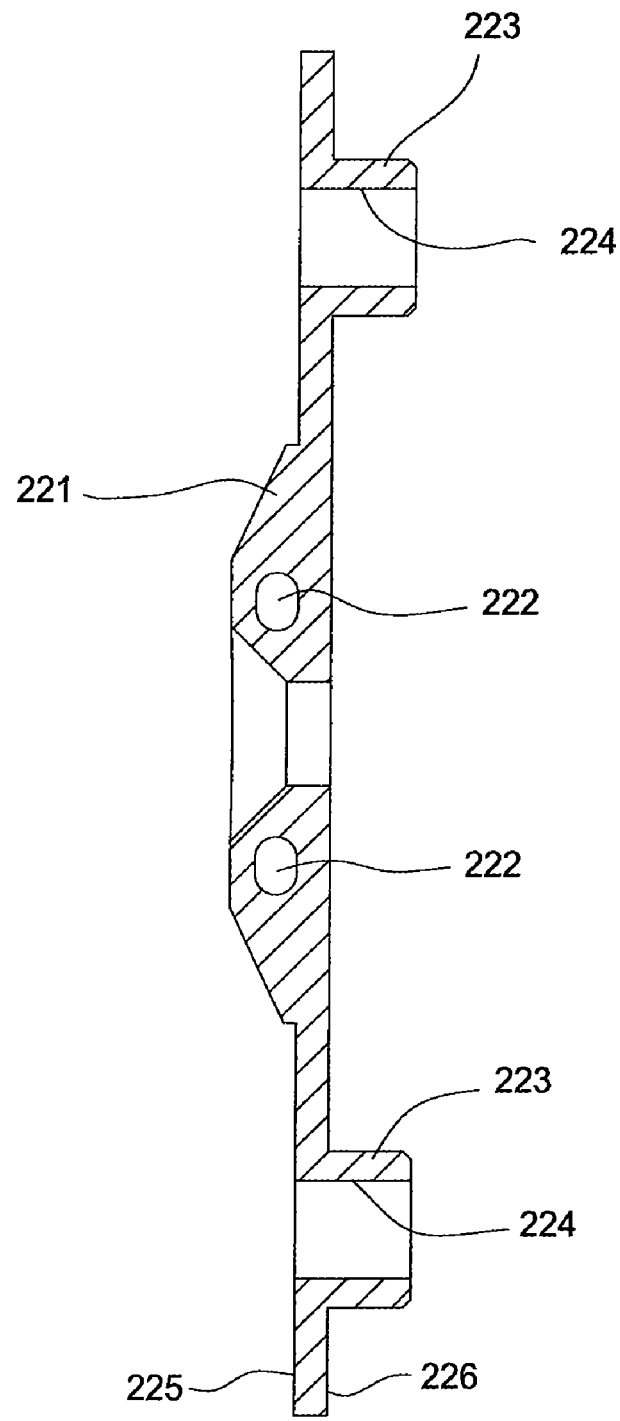
FIG. 5D is a schematic side view of the base member of FIG. 5C.

FIG. 5C is a schematic isometric view of the base member 220 for the end effector pad assembly 210 in accordance with one embodiment of the present invention. FIG. 5D is a schematic sectional side view of the base member 220.

The base member 220 has a substantial plate shape with a first side 225 configured to contact the pad member 230, and a second side 226 opposing the first side 225. The second side 226 is configured to be in contact with the end effector. In one embodiment, the base member 220 has a raised portion 221 on the first side 225. The raised portion 221 is configured to raise the pad member 230 to form a contact area. In one embodiment, the base member 220 has two columns 223 protruding from the second side 226. The columns 223 are configured to fit in the guide holes 124 in the end effector for aligning the end effector pad assembly 210. In one embodiment, a threaded hole 224 may be formed in each column 223 to couple with the screw 250 for assembly.

In one embodiment, the base member 220 has one or more service holes 222 formed therein. In one embodiment, the one or more service holes 222 are formed in the raised portion 221 in a direction along a width of the base member 220. The service holes 222 are configured to be exposed over the upper surface 136/138 when the end effector pad assembly 210 is disposed in the end effector. A tool may be inserted in service holes 222 to lift the end effector pad assembly 210 during maintenance.

In one embodiment, the base member 220 comprises a ferromagnetic material and is configured to be attached to the end effector by magnetic force. In one embodiment, the base member 220 is fabricated from a highly corrosion resistive alloy that is ferromagnetic. In one embodiment, the base member 220 is fabricated from a ferromagnetic material comprising nickel and molybdenum. In one embodiment, the base member 220 is fabricated from HASTOLLOY® alloy C276.

FIG. 5E is a schematic isometric view of the clamp member 240 for the end effector pad assembly 210. FIG. 5F is a schematic sectional side view of the clamp member 240. The clamp member 240 is a plate having a hole 241 configured to house the screws 250. In one embodiment, the clamp member 240 has a protrusion 242 configured to secure the pad member 230 by the holes 231. The clamp member 240 is formed from a metal, such as aluminum, stainless steel, or any suitable material.

FIG. 6A is an isometric view of an end effector pad assembly 310 in accordance with one embodiment of the present invention. The end effector pad assembly 310 may be used in place of the end effector assembly 110 of FIG. 1. The end effector pad assembly 310 is configured to "sit" within a pad recess 120 of the base or tip 102/104 of an end effector. The end effector pad assembly 310 comprises a pad member 330 having a contact structure 332 protruding from the end effector pad assembly 310 and the upper surface 136/138 of the end effector when the end effector pad assembly 310 is disposed on the end effector.

Figure 6B:
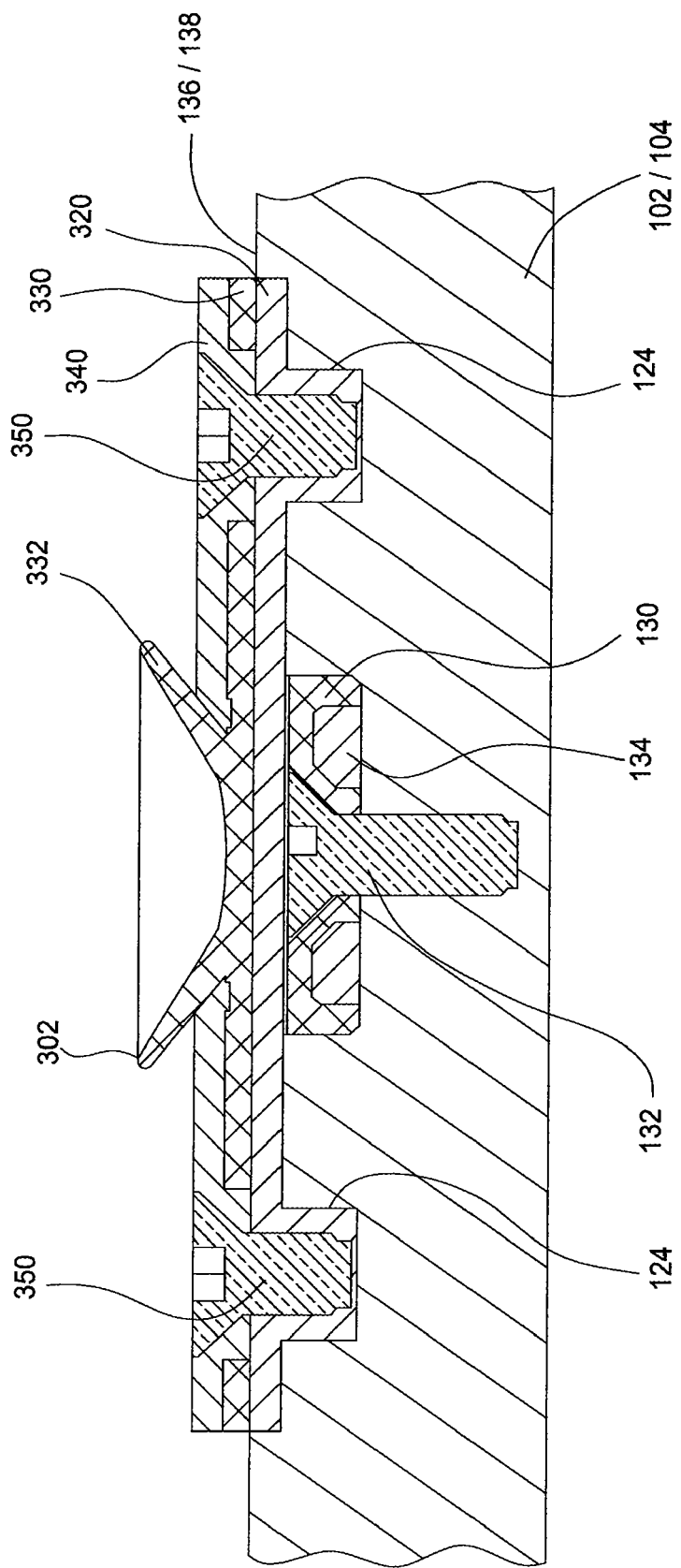
FIG. 6B is a side view of the end effector pad assembly of FIG. 6A when disposed on an end effector.

FIG. 6B is a schematic sectional view of the end effector pad assembly 310 disposed in the base/tip 102/104 of an end effector.

Figure 7A:
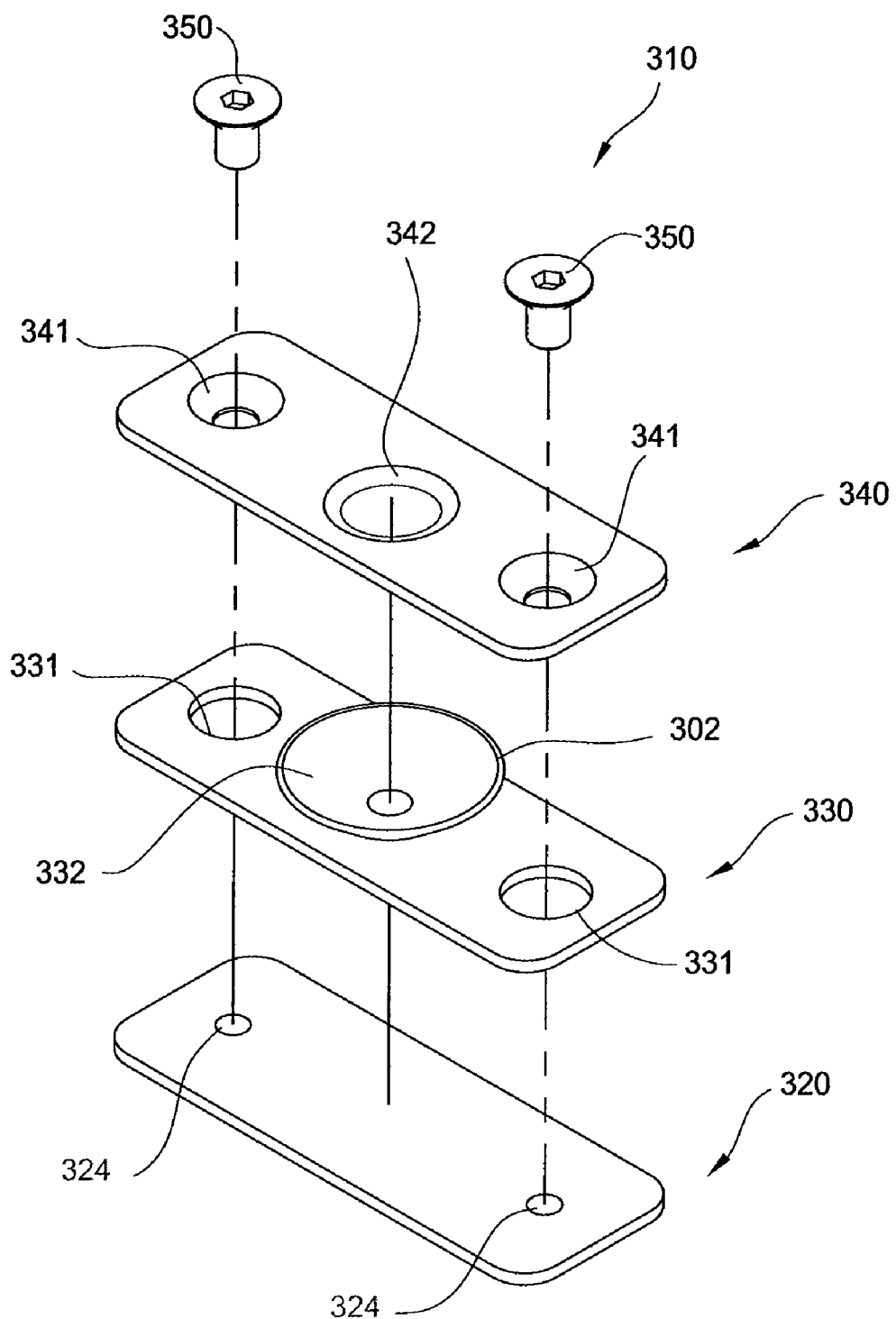
FIG. 7A is an exploded view of the end effector pad assembly of FIG. 6A.

FIG. 7A is a schematic exploded view of the end effector pad assembly 310. The end effector pad assembly 310 comprises a base member 320, a pad member 330, and clamp members 340 stacked together by screws 350. The base member 320 is configured to provide physical support to the end effector pad assembly 310 and to provide magnet attraction to magnets in the end effector.

The pad member 330 is fabricated from a flexible material and is configured to provide flexible contact structure to substrates being transferred. The end effector pad assembly 310 is preassembled and is configured to be disposed on the end effector and removed from the end effector in a whole.

Figure 7C:
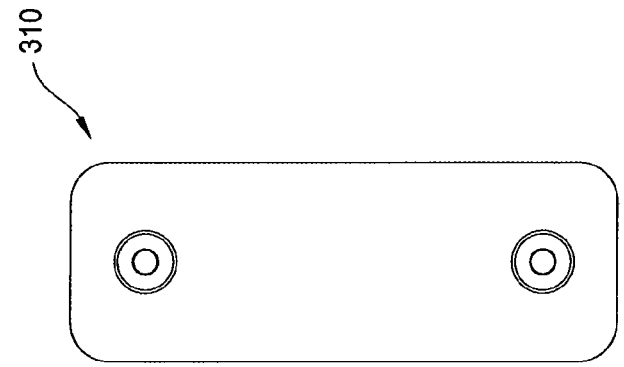
FIG. 7C is a top view of the end effector pad assembly of FIG. 7A.
Figure 7F:
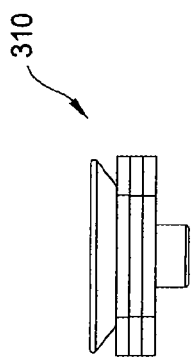
FIG. 7F is a short side view of the end effector pad assembly of FIG. 7A.
Figure 7D:
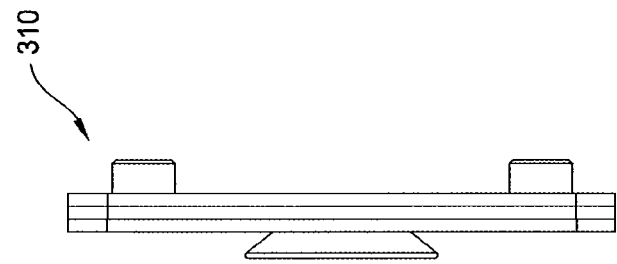
FIG. 7D is a second long side view of the end effector pad assembly of FIG. 7A.
Figure 7E:
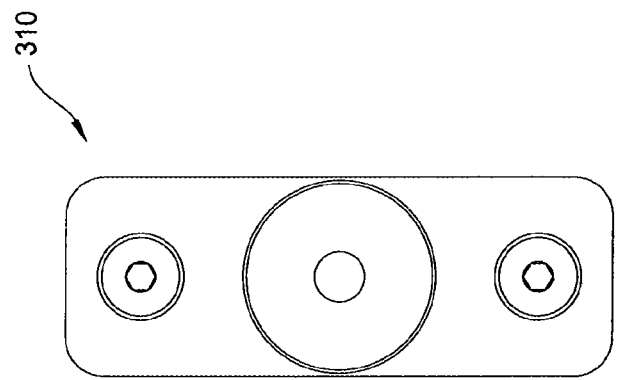
FIG. 7E is a bottom view of the end effector pad assembly of FIG. 7A.
Figure 7B:
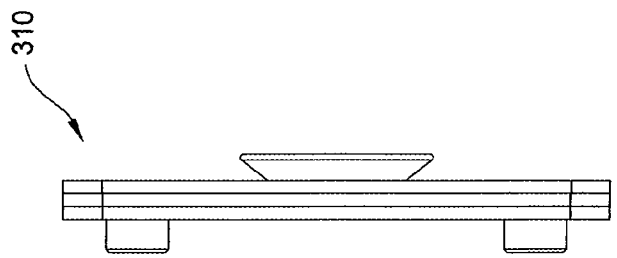
FIG. 7B is a first long side view of the end effector pad assembly of FIG. 7A.

FIG. 7B is a first long side view of the end effector pad assembly 310 as assembled. FIG. 7C is a top view of the end effector pad assembly 310 as assembled. FIG. 7D is a second long side view of the end effector pad assembly 310 as assembled. FIG. 7E is a bottom view of the end effector pad assembly 310 as assembled. FIG. 7F is a short side view of the end effector pad assembly 310 as assembled.

Figure 9A:
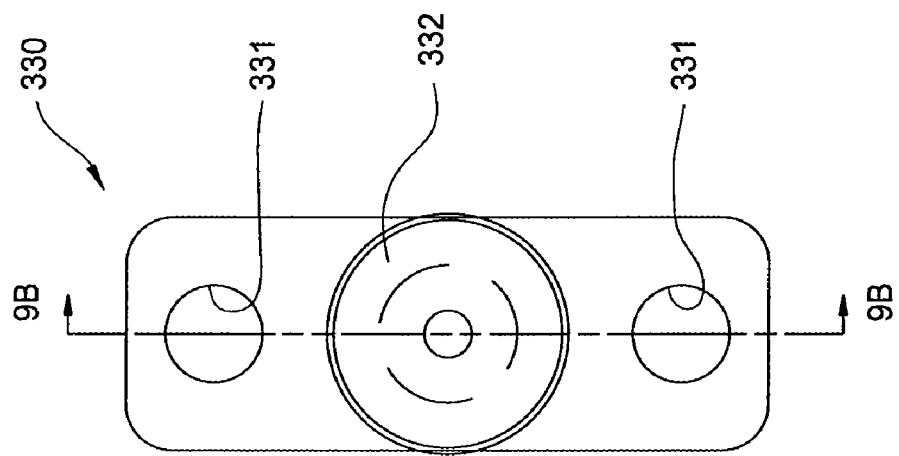
FIG. 9A is a top view of a pad member of the end effector pad assembly of FIG. 7A.
Figure 9B:
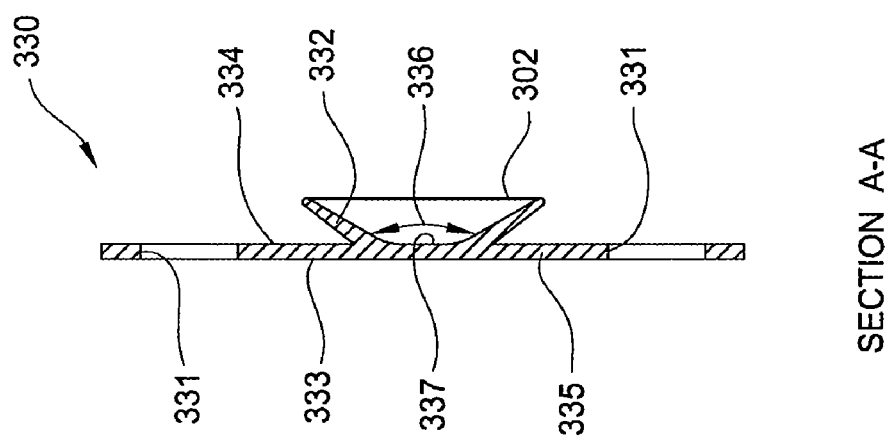
FIG. 9B is a sectional side view of the pad member of FIG. 9A.

FIG. 9A is a top view of the pad member 330 in accordance with one embodiment of the present invention. FIG. 9B is a sectional side view of the pad member 330.

The pad member 330 has a body 335 having a substantially a plate shape. The body 335 has a front side 334 and a back side 333. The back side 333 is configured to couple to the base member 320. The front side 334 has a contact structure 332 extending from the body 335. The contact structure 332 has a top surface 302 configured to contact a substrate being transferred.

In one embodiment, the contact structure 332 has a shape that is configured to provide a spring force for supporting the substrate. In one embodiment, the contact structure 332 has a cone shape with a wide end extending away from the body 335. Even though the cone shape is shown in FIG. 9B, the contact structure 332 can be of any suitable shape, for example, the contact structure 332 can be of a "U" shape. In one embodiment, the contact structure 332 provides a handle in removing the end effector pad assembly 310 from then the end effector 101 against magnetic force.

In one embodiment, the contact structure 332 is a cone shape having a substantially flat bottom 337. In one embodiment, the cone shape has an opening having a radius of about 0.6 inches. In one embodiment, the cone shape has an inner angle 336 of about 120 degrees.

In one embodiment, the pad member 330 has a pair of holes 331 configured to let through the clamp member 340 and the screws 350.

The pad member 330 may be fabricated from a flexible material that provides cushioning to the substrates being transferred. The pad member 330 is generally fabricated from material that will not scratch the substrate and is compatible with processing chemistry. In one embodiment, the pad member 330 is fabricated from a perfluoroelastomer. In one embodiment, the pad member 330 is fabricated from KAL-RETZ® elastomer by DuPont.

Figure 8A:
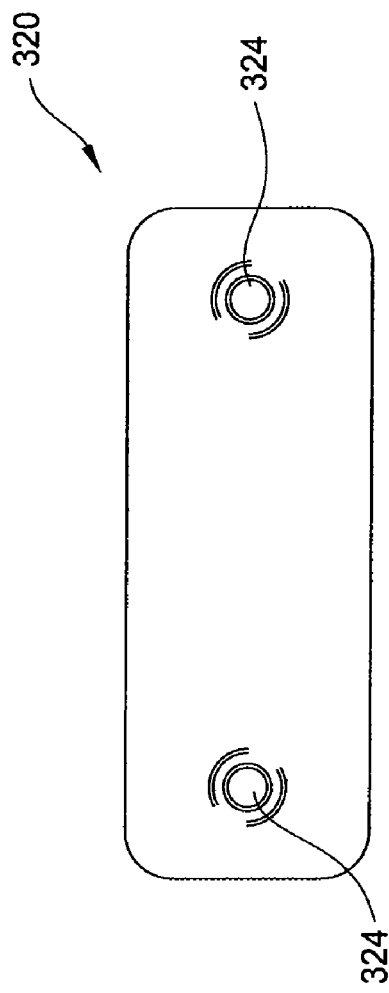
FIG. 8A is a top view of a base member of the end effector pad assembly of FIG. 7A.
Figure 8B:
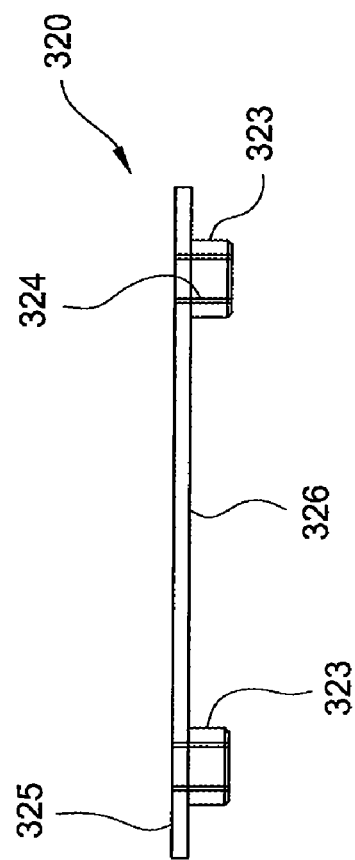
FIG. 8B is a side view of the base member of FIG. 8A.

FIG. 8A is a top view of the base member 320 in accordance with one embodiment of the present invention. FIG. 8B is a side view of the base member 320.

The base member 320 has a substantially plate shape with a first side 325 configured to contact the pad member 330, and a second side 326 opposing the first side 325. The first side 325 is configured to support the back side 333 of the pad member 330 and is substantially planar. The second side 326 is configured to be in contact with the end effector. In one embodiment, the base member 320 has two columns 323 protruding from the second side 326. The columns 323 are configured to fit in the guide holes 124 in the end effector for aligning the end effector pad assembly 310. In one embodiment, a threaded hole 324 is formed in each column 323 to couple with the screw 350 for assembly.

In one embodiment, the base member 320 comprises a ferromagnetic material and is configured to be attached to the end effector by magnetic force. In one embodiment, the base member 320 is fabricated from a highly corrosion resistive alloy that is ferromagnetic. In one embodiment, the base member 320 is fabricated from a ferromagnetic material comprising nickel and molybdenum. In one embodiment, the base member 320 is fabricated from HASTOLLOY® alloy C276.

Figure 10A:
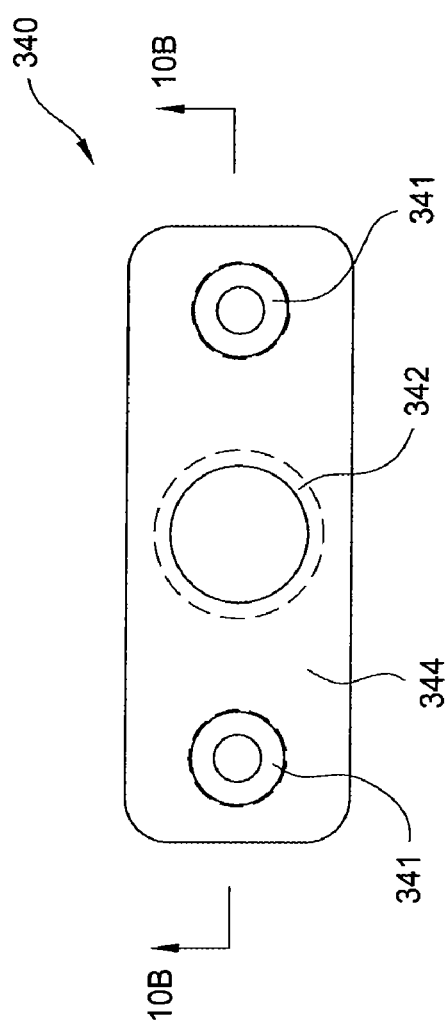
FIG. 10A is an isometric view of a clamp member of the end effector pad assembly of FIG. 7A.
Figure 10B:
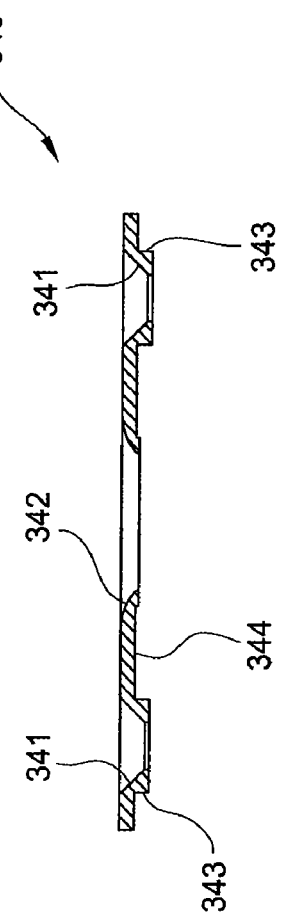
FIG. 10B is a sectional side view of the clamp member of FIG. 10A.

FIG. 10A is a top view of the clamp member 340 in accordance with one embodiment of the present invention. FIG. 10B is a sectional side view of the clamp member of FIG. 10A.

The clamp member 340 has a body 344 configured to press the pad member 330 against the base member 320. The clamp member 340 has a central hole 342 configured to allow the contact structure 332 therethrough. In one embodiment, the central hole 342 has a profile substantially matching an outer profile of the contact structure 332. In one embodiment, the clamp member 340 has two protrusion 343 configured to inserted into the holes 331 of the pad member 330. The clamp member 340 has two holes 341 formed through the body 344 and the protrusions 343 to allow the screws 350 therethrough.

In one embodiment, the clamp member 340 is formed from a metal, such as aluminum, stainless steel, or any suitable material.

Embodiments of the present invention provide an end effector having a plurality of magnetized pads for supporting large area substrates, particularly in a vacuum environment. Each magnetized pad has a soft, cushioning, or other surface that will not damage a substrate. The magnetized pads are easy to install and remove for easy maintenance, therefore, reduces cost of ownership.

While the foregoing is directed to embodiments of the present invention, other and further embodiments of the invention may be devised without departing from the basic scope thereof, and the scope thereof is determined by the claims that follow.

What is claimed is:

1. A pad assembly for an end effector, the pad assembly comprising:
   a base member adapted to secure the pad assembly to the end effector, the base member comprising a ferromagnetic material that is configured to be attached to the end effector by magnetic force, wherein the base member has a first side for contacting the end effector and a second side opposing the first side;
   a pad member coupled to the base member, wherein the pad member has a first side in contact with the second side of the base member and a second side opposing the first side of the pad member, and at least a portion of the second side of the pad member is raised to form a contacting area for receiving and supporting a substrate; and
   a fastening means to join the base member and the pad member, wherein the base member has two columns extending from the first side, and the two columns are configured to fit in recesses formed in the end effector.

2. The pad assembly of claim 1, wherein the pad member comprises a contact structure forming the contacting area.

3. The pad assembly of claim 2, wherein the contact structure comprises a cone structure.

4. The pad assembly of claim 1, wherein the pad member comprises a raised structure extending from the second side of the pad member, and a far end of the raised structure forms the contacting area.

5. The pad assembly of claim 4, wherein the raised structure is a cone and the contacting area comprises an open end of the cone.

6. A pad assembly for an end effector of a vacuum robot, the pad assembly comprising:
   a pad member configured to provide a contact area for supporting a substrate using the vacuum robot, wherein the pad member has a first side and a second side opposing the first side, wherein the first side is substantially planar, the second side has a contact structure extending therefrom and a top surface of the contact structure forms the contact area;
   a base member adapted to secure the pad assembly to the end effector, wherein the base member is in contact with the first side of the pad member;
   a clamp member contacting the second side of the pad member, wherein the clamp member has a hole allowing the contact structure to be exposed; and a fastening means to join the base member, the pad member and the clamp member, wherein the contact structure is a cone structure, and an open end of the cone structure forms the contact area.

7. The pad assembly of claim 6, wherein the base member comprises a ferromagnetic material and is configured to secure the pad assembly to the end effector by magnetic force.

8. A pad assembly for an end effector, the pad assembly comprising:
- a base member having a first side for contacting the end effector and a second side opposing the first side;
- a pad member having a first side in contact with the second side of the base member and a second side opposing the first side of the pad member;
- a clamp member to fix the base member to the pad member; and
- a raised structure providing a contact area for supporting a substrate, wherein the base member has two columns extending from the first side.

9. The pad assembly of claim 8, wherein the raised structure comprises a cone structure.

10. The pad assembly of claim 9, wherein the cone structure protrudes through an opening in the clamp member.

11. The pad assembly of claim 8, wherein the raised structure is disposed on the pad member.

12. The pad assembly of claim 11, wherein the raised structure comprises a cone structure.

13. The pad assembly of claim 12, wherein the cone structure protrudes through an opening in the clamp member.

* * * * *